United States Patent [19]

Strid

[11] Patent Number: 4,764,723
[45] Date of Patent: Aug. 16, 1988

[54] WAFER PROBE

[75] Inventor: Eric W. Strid, Portland, Oreg.

[73] Assignee: Cascade Microtech, Inc., Beaverton, Oreg.

[21] Appl. No.: 928,987

[22] Filed: Nov. 10, 1986

[51] Int. Cl.[4] ............................. G01R 1/06; H01P 3/08
[52] U.S. Cl. ............................ 324/158 P; 324/158 F; 324/73 PC; 333/246
[58] Field of Search ............ 324/158 P, 158 F, 73 PC, 324/72.5; 333/1, 246; 357/74, 80

[56] References Cited

U.S. PATENT DOCUMENTS

| | | | |
|---|---|---|---|
| 4,184,133 | 1/1980 | Gehle | 333/246 |
| 4,551,747 | 11/1985 | Gilbert et al. | 357/74 X |
| 4,553,111 | 11/1985 | Barrow | 333/1 |
| 4,593,243 | 6/1986 | Lao et al. | 324/158 F |

OTHER PUBLICATIONS

Bry et al., "By Pan Capacitor for Chip Probe"; IBM Technical Disclosure Bulletin; vol. 18, No. 11, 04/1976.

Primary Examiner—Reinhard J. Eisenzopf
Assistant Examiner—Vinh P. Nguyen
Attorney, Agent, or Firm—Dellett, Smith-Hill and Bedell

[57] ABSTRACT

A wafer probe for testing semiconductor devices brings low impedance connections closely adjacent device bonding pads for bypassing power supply voltages.

17 Claims, 6 Drawing Sheets

WAFER PROBE

BACKGROUND OF THE INVENTION

The present invention relates to integrated circuits (IC) measurement generally, and particularly to wafer-type probes for measurement of electrical characteristics of small planar devices (IC elements) fabricated on semiconductive or dielectric wafers.

Wafer probes provide temporary electrical contacts between test equipment and the very small terminal points (bonding pads) of IC elements on semiconductive wafers. Use of wafer probes permits operation and testing of IC elements prior to separating, bonding and packaging the individual IC elements on the wafer.

A major problem with most wafer probes is their inability to permit accurate measurements of the electrical characteristics of the devices at high frequencies (e.g., when signal frequencies above approximately 2 GHz are applied). These inaccuracies arise from high frequency characteristics of the probes themselves. At high frequencies, excessive probe inductance or changing probe radiation impedance can greatly reduce the accuracy of tests made. Although the use of computer-corrected measurements may reduce the adverse effect of excess inductance to some extent, the radiation is generally not repeatable and, therefore, not correctable.

These inaccuracies were significantly reduced by the improved wafer probe described and claimed in prior applications, Ser. No. 318,084 filed Nov. 4, 1981 now abandoned, and Ser. No. 605,462 filed Apr 30, 1984, now U.S. Pat. No. 4,697,143. These prior probes provided for reduction of inductance of the probe tip to less than fifty pH. The wafer probes employed microstrip or coplanar lines sufficiently narrowed on a tapered support to make good contact with bonding pads of the device to be tested, and to conduct signals to the pads from conventional fifty ohm coaxial cables. The fifty ohm environment was brought close to the device or chip being measured, reducing radiation and the like. Absorptive material was also provided for preventing undesired resonance and radiation.

In addition to connecting signal lines between the device under test and a measurement instrument, some provision must be made for supplying power to the device under test. Thus, the device under test may include a plurality of bonding pads, some of which are to receive signals and others which are to be connected to a source of voltage or grounded. It is desirable that the power connection be of low impedance because the current drawn may have frequency components covering a very broad bandwidth, this being especially true for digital circuits. Thus, a data input may have a long series of values which result in little current change, and then a bit may occur which changes many internal logic states and forces a rapid change in current. Then this state may remain constant for a comparatively long period. Excessive inductance in the power supply circuit can result in a voltage changing by $L \times dI/dt$. Previous probing (and packaging) techniques have relied on placing a bypass capacitor near the device under test, at the tip of the probe or next to the chip or the like in the package, to absorb current fluctuations. However, the physical proximity of the capacitor, and the inductance of the connection from the capacitor to the chip, has a resonant frequency which can degrade the bypass quality. Moreover, if several inputs must be bypassed, the problem is aggravated since it is more difficult to place several capacitors in close proximity to the end of a probe next to the device.

SUMMARY OF THE INVENTION

In accordance with the present invention in a particular embodiment thereof, the problem of undesired fluctuation in the supply voltage at the device end of a probe is alleviated by employing very low impedance transmission lines in conjunction with the signal lines of predetermined higher impedance, wherein the low impedance transmission lines are interleaved with and can be coupled to the signal lines and device pads for providing bypassing. Thus, for example, when it is desired to apply a predetermined voltage to a device pad, the signal line connecting to that pad may be supplied with the proper voltage, and a cross connection is made proximate the tip end of the probe to a lower impedance line leading to a bypass network removed from the narrow end of the probe. Bypass capacitors and the like can be located physically far from the chip or device under test, at the far end of the low impedance transmission line, where circuit paths have diverged physically and there is space for as much capacitance as may be desired. Furthermore, a signal transmission line can be terminated in its characteristic impedance (e.g. fifty ohms) coupling the probe tip end of the transmission line either to ground or to one of the low impedance power transmission lines connected to a power source.

In a specific embodiment, the interleaved, low impedance transmission lines had an impedance of approximately four ohms. The parasitic inductance for the power connections is less than 0.3 nH, a value lower than achieved for other probing techniques.

In a specific example, the probe is formed by a plurality of metallic layers on a probe board wherein the first metal layer is used for the ground side of power transmission lines and for crossunder bars equalizing potentials on either side of intervening, coplanar waveguide fifty ohm signal lines. Lines of a second layer of metal, spaced in a different plane and insulated from the first layer of metal, alternately form fifty ohm signal lines and the low impedance power lines. Very adequate isolation is provided in this configuration between signal conductors. The power traces form low impedance, microstrip transmission lines with the juxtaposed ground conductors. As a result of the multilayer metal construction, both signal lines and low impedance lines are converged at the probe tip to a very small spacing required to bring the desired impedance levels to the chip or device under test, with the power supply by-passing thereby being brought substantially directly to the bond pads of the chip or device under test. Exceptionally high performance and test repeatability has been experienced with this device.

It is accordingly an object of the present invention to provide an improved wafer probe for making connection to a device under test by means of appropriate signal lines and very low impedance power and/or bypass lines.

It is another object of the present invention to provide an improved probe for contacting and testing small semiconductor devices wherein voltage supply values can be held to close tolerances.

It is a further object of the present invention to provide an improved probe for testing small semiconductor devices wherein power bypass components can be removed from the tip end of the probe, removing undesired reflections and enhancing test repeatability.

The subject matter of the present invention is particularly pointed out and distinctly claimed in the concluding portion of this specification. However, both the organization and method of operation, together with further advantages and objects thereof, may best be understood by reference to the following description taken in connection with accompanying drawings wherein like reference characters refer to like elements.

DETAILED DESCRIPTION

Figure 1:
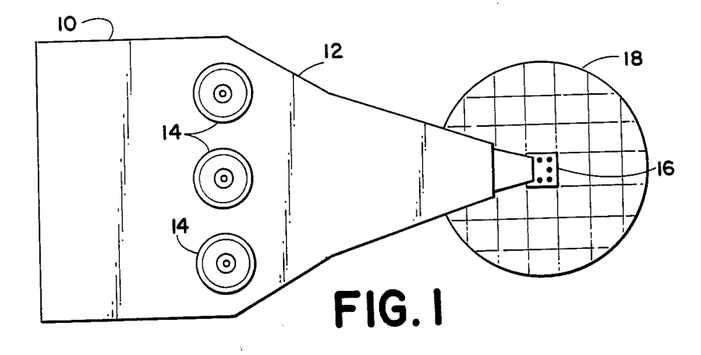
FIG. 1 is a plan view of a wafer probe in relation to a wafer element to be tested.

Referring to FIG. 1, a probe configuration according to the present invention suitably comprises a probe mounting block 10 carrying a transmission line assembly 12 and provided with a plurality of coaxial connectors 14. The probe is shown in its intended use, engaging minutely spaced bonding pads of a planar device 16 on wafer 18 for testing selected circuit components of planar device 16.

Figure 2:
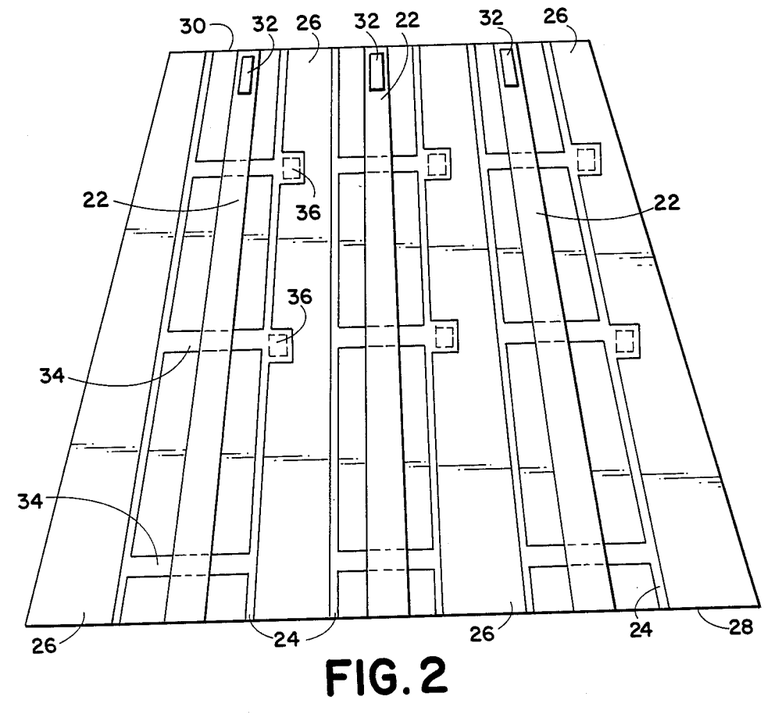
FIG. 2 is a bottom view of a portion of a wafer probe in accordance with the present invention.
Figure 3:
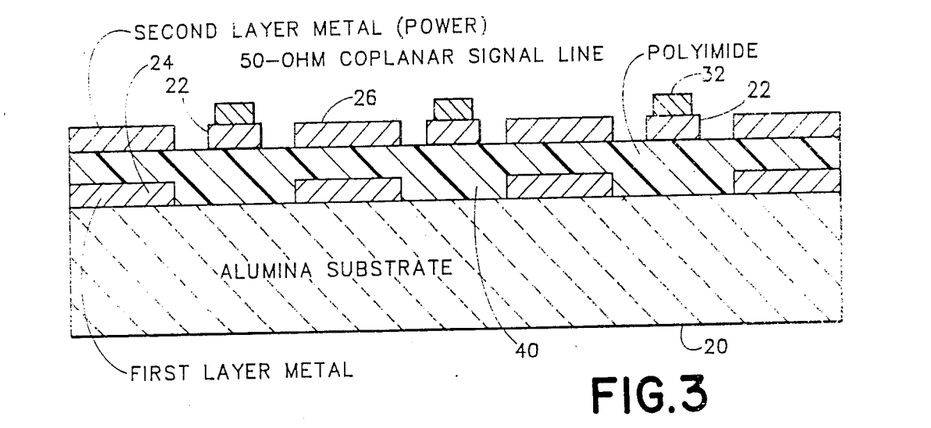
FIG. 3 is a vertical cross-section through the FIG. 2 water probe.

Referring to FIGS. 2 and 3, the transmission line assembly comprises a plurality of conductors mounted on a tapered board 20 made of a dielectric material such as alumina ($AL_2O_3$). Signal conductors 22 and ground conductors 24, as well as power conductors 26, are strips of conducting material such as gold carried by the alumina substrate of the probe board. Ground conductors 24 comprise spaced, substantially parallel conductive strips extending from connector end 28 of the board to tip end 30 thereof, the ground conductors comprising a first layer of metal deposited upon an alumina substrate. An insulating dielectric layer, suitably polyimide, is deposited over the first layer of metal, as illustrated in FIG. 3, and a second layer of metal is deposited thereover. The second layer of metal comprises substantially parallel signal conductors 22 interspersed between substantially parallel power conductors 26. As will be seen from FIG. 2, the conductor layers taper from the connector end 28 of the board to a narrower dimension at tip end 30 of the board so as to make contact with the bonding pads of the device under test via connectors 32 deposited over the tip ends of the signal conductors. The conductors and supporting board are longer and taper to a greater extent than illustrated in FIG. 2, with FIG. 2 being somewhat schematic and enlarged for ease of explanation. The tapering of the signal conductors, as well as the spacing between conductors, and the frequency of positioning of crossunders 34 passing under signal conductors to join the ground conductors, maintain a fifty ohm characteristic impedance as the line widths taper down to the probe tip. This brings the fifty ohm environment down to the bonding pads. It will be seen that coplanar signal waveguides are provided by signal conductors 22, each having conductors 26 on either side thereof in close proximity to juxtaposed ground conductors 24. Furthermore, in accordance with the present invention, the conductors 26 form strip lines with the juxtaposed ground conductors 24 and are used for power leads and/or for connecting bypass means directly to the signal conductors in the direct vicinity of the bonding pads. While the characteristic impedance of the coplanar waveguide or transmission lines comprising conductors 22–26 is approximately fifty ohms, the characteristic impedance of the strip lines comprising conductors 26 and 24 is extremely low, in the vicinity of four ohms. As will hereinafter be more fully explained, the tip ends of selected signal conductors 22 may be connected directly to the tip end of one of the power conductors 26, or by way of a terminating resistor to a power conductor 26. Alternatively, the tip end of the signal conductors can be connected to ground by way of one of plural ground vias 36, or the terminating resistor may be similarly employed between the tip end of a signal conductor 22 and one of the ground vias.

Figure 4:
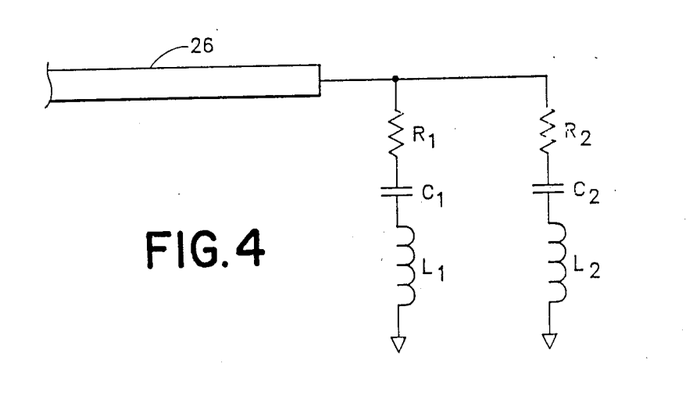
FIG. 4 is a schematic diagram of a bypass termination employed with the probe according to the present invention.

A principal purpose of the power conductors 26 is to provide convenient bypassing of the tip ends of the signal conductors, and the device pads to which they connect, substantially at the tip end of the probe. The low impedance line formed by a power conductor leads back to the wide end of the probe where a bypassing network can be accommodated spacewise. A preferred bypassing network, comprising a split-band, all-pass network at the frequencies of interest, is illustrated in FIG. 4 and includes a first series circuit comprising resistor $R_1$, capacitor $C_1$ and inductance $L_1$ disposed between conductor 26 and ground. A second series circuit is also shunted from line to ground and includes resistor $R_2$, capacitor $C_2$ and inductance $L_2$. Resistors $R_1$ and $R_2$ are each suitably four ohms in value for terminating the low impedance line. The first combination of $R_1$ $C_1$ and $L_1$ acts to terminate the line at extremely high frequencies, e.g., in the region of 10 GHz, and consequently inductance $L_1$ must be extremely low. The second combination of $R_2$ $C_2$ and $L_2$ is effective at slightly lower frequencies and $C_2$ is very large, on the order of 0.01 microfarads. The whole network is effective as an all-pass network and takes the place of a single bypass capacitor over a frequency range of interest, without introducing excessive reactive components, while terminating the low impedance line in satisfactory manner.

In the circuit of FIG. 4, $L_1$ is minimized, $C_2$ is maximized and $(L_2/C_1)^{\frac{1}{2}}=$ four ohms. $L_1$ is minimized by providing extremely short leads for $R_1$ and $C_1$, the latter comprising a "gap-cap" capacitor. $R_1$ is printed under the gap in the mounting pads or the "gap-cap" capacitor in a manner to be described in connection with FIG. 5. The second half of the split-band all-pass network suitably embodies the 0.01 microfarad capacitor $C_2$ as a ceramic chip cap, and $L_2$ is just the parasitic inductance encountered in connecting $C_2$.

Figure 5:
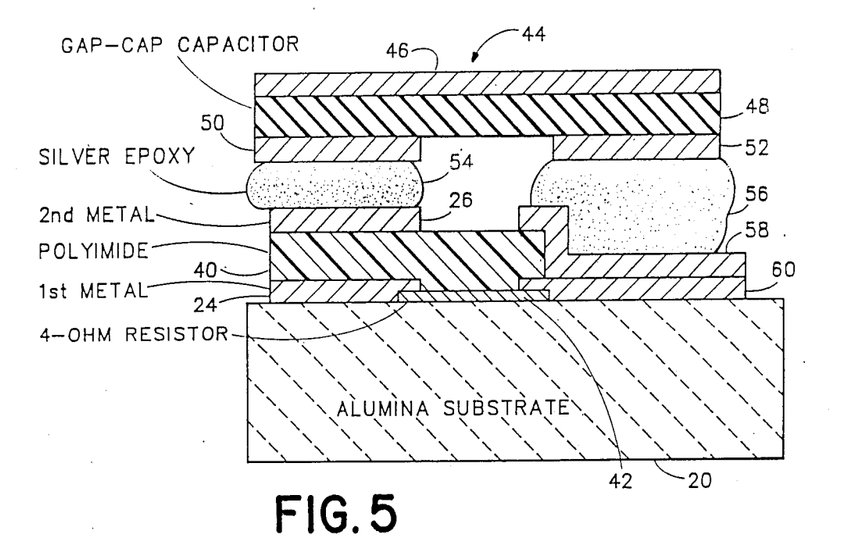
FIG. 5 is a cross-section of a wafer probe embodiment of a portion of the FIG. 4 circuit.

Referring to FIG. 5, illustrating more fully the first part of the all-pass network, this circuit is desirably implemented on the same alumina substrate 20 as the probe at a point remote from the tip end of the board, where sufficient space is available. The power conductor 26 at the end thereof remote from the board tip is superimposed by gap-cap capacitor 44 forming $C_1$. The gap-cap capacitor includes conducting layer 46 bridging underlying metal layers 50 and 52 and separated therefrom by thin dielectric layer 48. A layer of silver epoxy 54 joins power conductor 26 to layer 50 of the capacitor, it being understood the power conductor 26 is supported on polyimide layer 40 above ground conductor 24 on substrate 20. Layer 52 of the capacitor is connected by way of silver epoxy 56 to a conductive layer 58 disposed in a via in the polyimide for making contact with conductor 60 forming part of the first layer metal of the device but isolated from grounded portions of the first layer metal. The resistor $R_1$ for the circuit comprises a printed resistive layer 42 on the alumina substrate for making connection between metal conductors 24 and 60. The inductance ($L_1$) of the circuit is extremely low and substantially constitutes the inductance of the contacts. The second half of the all-pass network in FIG. 4 is implemented in a somewhat more conventional manner with the higher capacitance and wherein a slightly larger lead inductance, $L_2$, can be tolerated.

Figure 6:
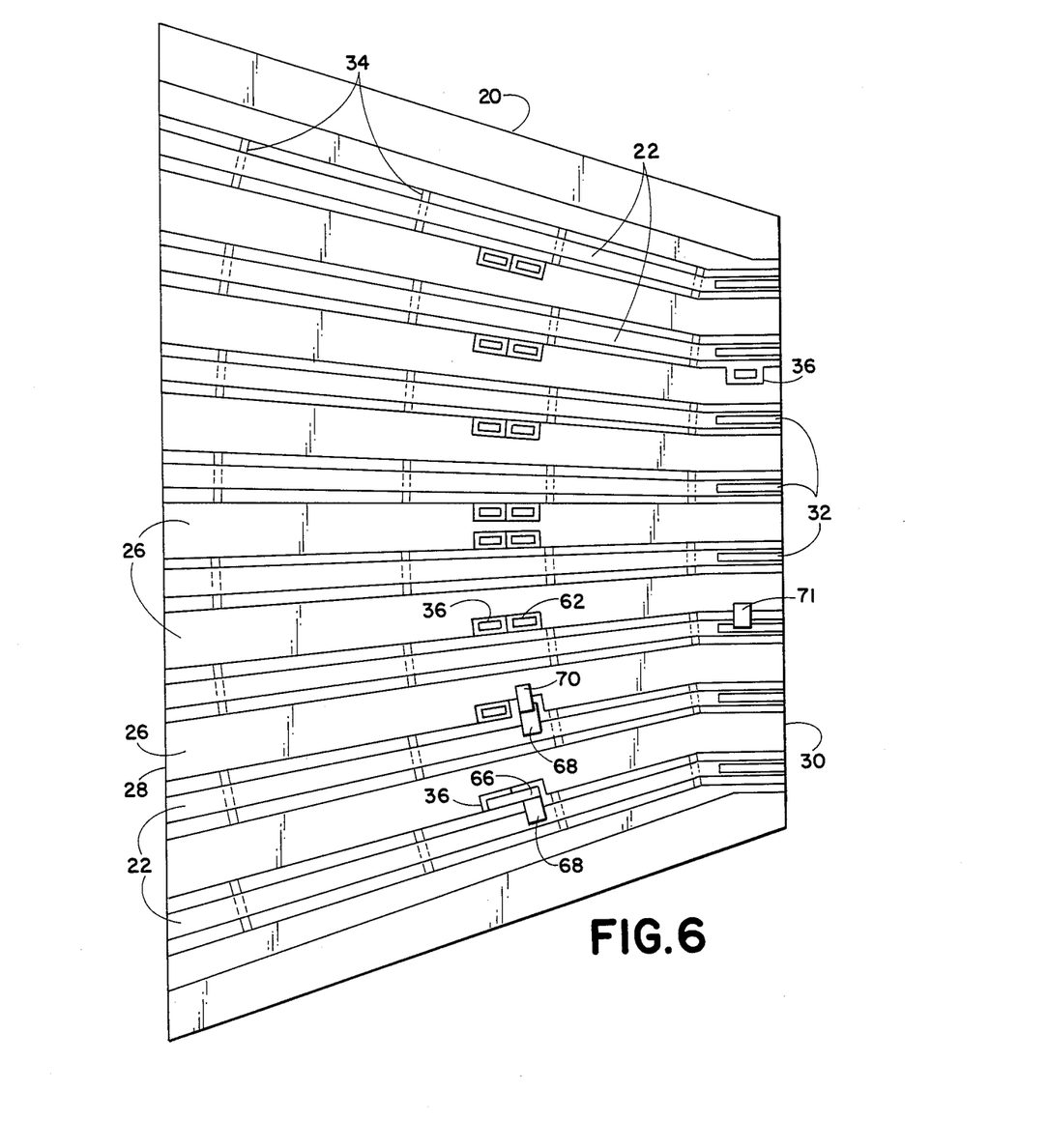
FIG. 6 is a more detailed view of the underside of a wafer probe according to the present invention, FIG. 7 comprises a number of equivalent circuits for exemplary connection of the subject wafer probe.

FIG. 6 is a more detailed illustration of a portion of a wafer probe according to the present invention, wherein reference numerals correspond substantially to those used in FIGS. 2 and 3. In the illustrated embodiment of FIG. 6, eight signal conductors 22 extend to connections 32 at the tip end of the probe board, while the power conductors 26, forming the lower impedance lines, are interspersed therebetween. In this view, various terminating connections and resistances are illustrated. The nomenclature for the types of connections is described in FIG. 7. Deposited layer 68 comprises deposited resistance, suitably fifty ohms in value, to match or terminate one of the signal conductors 22. One end of 68 makes contact with a signal conductor 22, while the remaining end is connected to an underlying isolated contact 62 through a corresponding via. Layer 68 is present in the corresponding position on all lines 22 but is not shown. In the case of a terminated signal line, connection is made by strap 66 through a grounding via 36 to the underlying ground layer 24, while in the case of a reference voltage terminated signal line, the remote end of resistor 68 is joined to power conductor 28 by connection 70. In the case of a low impedance bypass, strap 71 connects the signal line 22, to the power line 26.

Figure 7:
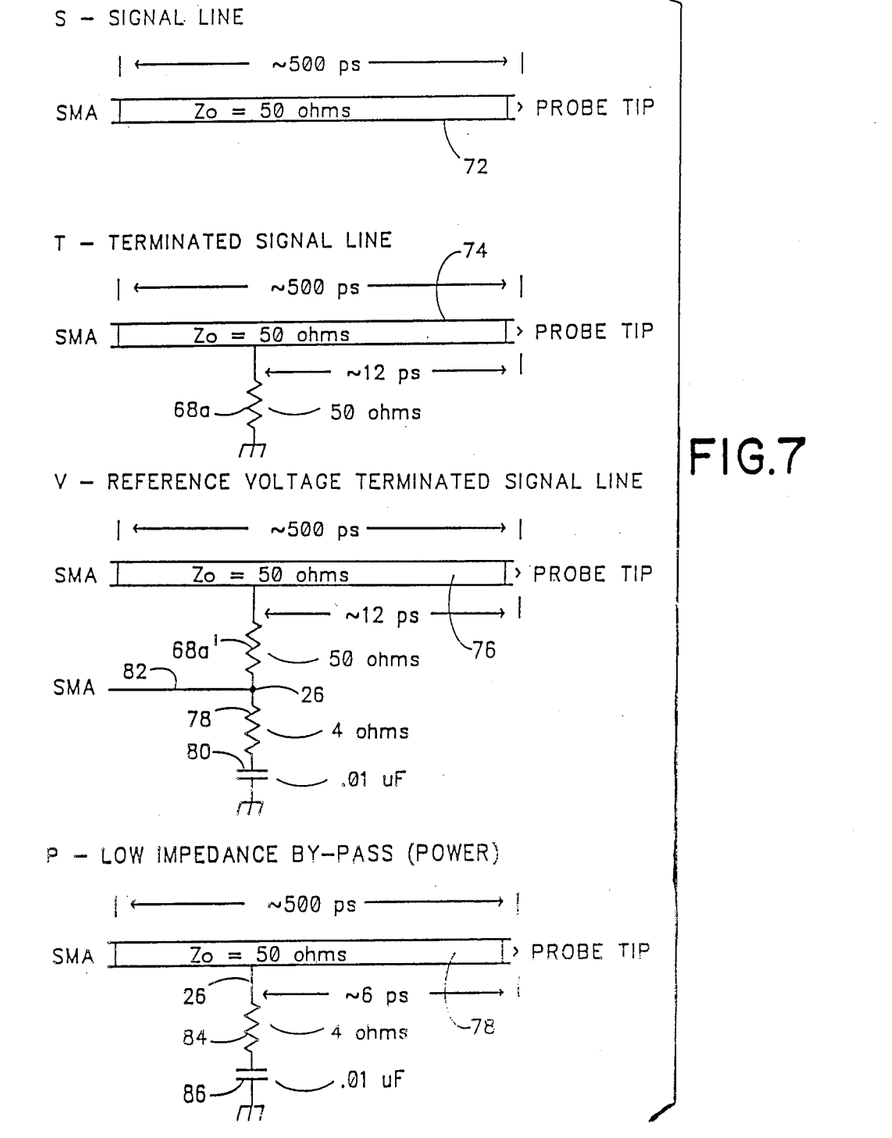

The various circuit configurations which can be achieved are more fully illustrated schematically in FIG. 7. At the top of the figure, transmission line 72 is illustrative of one of the signal conductors 22 which provides the fifty ohm impedance connection to the probe tip without any special termination. This will be the case for many connections providing a signal path between the pads of the device under test and the coaxial connectors 14 (FIG. 1). Next illustrated in FIG. 7 is a terminated line 74 where a fifty ohm resistance 68a is disposed between the line and ground for matching the impedance of the line. In this instance, a conductive layer 68 in FIG. 6 would comprise the fifty ohm terminating resistor, and connection 66 would complete the circuit to ground.

Thirdly in FIG. 7, a line 76 is depicted wherein a fifty ohm termination resistor 68a' returns the tip end of the line to a low impedance four ohm power line indicated at 26, the latter being terminated with a bypass network represented by resistor 78 and capacitor 80. Referring briefly to FIG. 6, the layer 68 forms the fifty ohm terminating resistor 68a, while connection 70 leads to the low impedance conductor 26. Of course, the bypass network is positioned conveniently at the wide end of the board (not shown in FIG. 6), and suitably includes the gap-cap capacitor configuration illustrated in FIG. 5. A power connection is suitably made at the wide end of the board employing a coaxial connector 14 which is connected at point 82 in FIG. 7. The circuit including line 76 is suitable for providing the correct terminating impedance which is returned to a specified voltage level as applied at point 82.

In the case of line 78 in FIG. 7, the tip end of the line is returned back up the board by way of a low impedance conductor 26, wherein the low impedance line thus formed is terminated in a bypassing network represented by resistor 84 and capacitor 86 (again constituting the structure discussed in connection with FIGS. 4 and 5). In this case, the strap 71 in FIG. 6 is a direct connection to the conductor 26. This example allows direct bypassing at a low impedance level to the probe tip by way of the low impedance four ohm line provided by conductor 26. The actual voltage connection in this case may be made with one of the coaxial connectors 14 that normally connects to the conductor 22 forming part of line 78.

In the configurations illustrated in FIGS. 2 and 6, it is seen the signal conductors 22 are separated by the power conductors 26 which complete coplanar waveguide configurations with the signal conductors. This construction is found to operate in a very satisfactory manner even though actual ground conductors 24 are spaced immediately below the power conductors 26 for simultaneously forming low impedance strip lines. This configuration in two layers also provides the necessary isolation between the signal conductors 22 so that cross talk is reduced to a very low value. The cross talk between signal lines is substantially the same as if the power conductors 26 were shorted to the first layer metal ground conductors 24 therebeneath. The two-layer metal construction thereby provides both the fifty ohm signal connections and low impedance bypassing connections, which are converged to the probe tip. The low impedance, e.g. four ohm, value for the power conductors is substantially maintained at the probe tip, although it may increase slightly for narrow probe tips when the power conductors 26 become very narrow.

Figure 8:
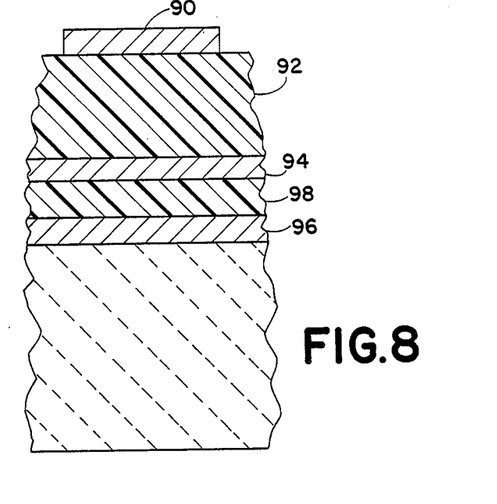
FIG. 8 is a cross-section of a wafer probe embodiment according to a second embodiment of the present invention.

Although the foregoing embodiments of the invention are preferred because of their extremely compact nature and the advantages of a two-layer construction, alternative embodiments can also be employed. The first such embodiment is illustrated in FIG. 8 wherein a signal conductor 90 is disposed over a dielectric layer 92 having a first metal layer 94 positioned on the opposite side thereof. A second metal underlayer 96 is spaced from layer 94 by a thinner layer 98 of dielectric material. A first transmission line for coupling signals to a probe tip is provided between conductors 90 and 94 wherein spacing 92 determines a first characteristic impedance. The lower layer 96 forms a much lower impedance line with layer 94 and can be used as a power connection. Alternatively, the roles of layers 94 and 96 can be interchanged.

Figure 9:
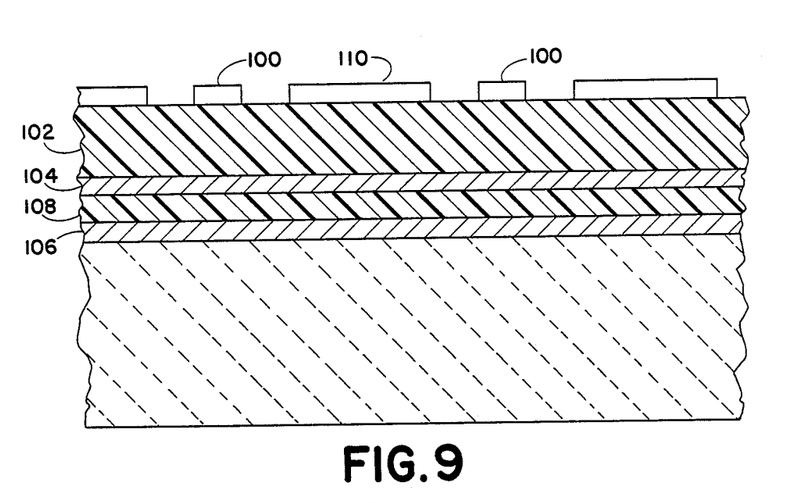
FIG. 9 is a cross-sectional view of a portion of a probe according to a third embodiment of the present invention.

A version of the FIG. 8 embodiment is shown in FIG. 9 which is suitable for a plurality of signal lines. In this case, a plurality of signal conductors 100 is disposed over a thicker dielectric layer 102 having an underlayer 104 which may be grounded to form strip lines with signal conductors 100. One or more power conductors 106 are separated from layer 104 by thinner dielectric layer 108 and provide a power connection. Alternatively, the roles of layers 104 and 106 can be reversed. In this embodiment, signal conductors 100 are separated by ground or power conductors 110 for accomplishing isolation. This structure is somewhat complicated and therefore the structures of FIGS. 2, 3 and 6 are preferred. It should be noted that the roles of the power conductors and the ground conductors in the embodiments of FIGS. 2, 3 and 6 can also be reversed if desired to form yet other embodiments of the present invention.

While several embodiments of the present invention have been shown and described, it will be apparent to those skilled in the art that many changes and modifications may be made without departing from the invention in its broader aspects. The appended claims are therefore intended to cover all such changes and modifications as fall within the true spirit and scope of the invention.

I claim:

1. A probe having a connector end and a probe tip end and adapted for connecting electrical test equipment to selected points on a semiconductor wafer, said probe comprising:
   a support carrying a plurality of mutually insulated conductive paths in multiple layers, including plural first pairs of said conductive paths forming plural first transmission lines of predetermined impedance between said connector end and said probe tip end, and
   plural second conductive paths forming plural second transmission lines with ones of said first pairs of paths, said second transmission lines also extending between said connector end and said probe tip end and having substantially lower impedance than said predetermined impedance.

2. The probe according to claim 1 wherein said support and said conductive paths are tapered between said connector end and said probe tip, ones of said conductive paths having narrower width and spacing toward said probe tip.

3. The probe according to claim 1 wherein said second conductive paths comprise a first layer on said support and said first pairs of conductive paths comprise a second layer insulated from said first layer, said second transmission lines comprising strip lines and said first transmission lines comprising substantially coplanar lines.

4. A probe adapted for connecting electrical test equipment to selected points on a semiconductor wafer, said probe comprising:
   a transmission line assembly having a probe board with plural metallic signal conductors and plural metallic ground conductors deposited on said probe board, said signal conductors providing first transmission line paths,
   said transmission line assembly further including metallic power conductors forming second transmission line paths with said plural ground conductors, said second transmission line paths being generally parallel to but of lower characteristic impedance than said first transmission line paths.

5. The probe according to claim 4 wherein said probe probe board and ones of said metallic conductors are tapered to become narrower and more closely spaced proximate locations of connection with said semiconductive wafer.

6. A probe adapted for connecting electrical test equipment to selected points on a semiconductor wafer, said probe comprising:
   a transmission line assembly having a probe board with plural metallic signal conductors and plural metallic ground conductors deposited on said probe board, said signal conductors providing first transmission line paths,
   said transmission line assembly further including metallic power conductors forming second transmission line paths with said ground conductors, said second transmission line paths being generally parallel to but of lower characteristic impedance than said first transmission line paths,
   wherein said ground conductors are provided as spaced portions of a first metallic layer on said board, and wherein said signal conductors and said power conductors are provided as spaced interleaved portions of a second metallic layer spaced and insulated from said first metallic layer.

7. The probe according to claim 6 wherein said power conductors are juxtaposed opposite said ground conductors to provide microstrip transmission lines having said lower impedance, and wherein said signal conductors form substantially coplanar transmission lines with said power conductors having said predetermined impedance.

8. A probe adapted for connecting electrical test equipment to selected points on a semiconductor wafer, said probe comprising:
   a transmission line assembly having a probe board with plural metallic signal conductors and plural metallic ground conductors deposited on said probe board, said signal conductors providing first transmission line paths,
   said transmission line assembly further including metallic power conductors forming second transmission line paths with said ground conductors, said second transmission line paths being generally parallel to but of lower characteristic impedance than said first transmission line paths,
   including means coupling a selected first transmission line path and a selected second transmission line path proximate connections with said semiconductive wafer.

9. The probe according to claim 8 wherein said coupling means comprises a terminating resistance.

10. The probe according to claim 9 including bypass terminating means connected to said selected second transmission line path proximate locations of connections adapted for said test equipment.

11. The probe according to claim 10 wherein said bypass terminating means comprises an all-pass network for frequencies of interest.

12. The probe according to claim 8 wherein said coupling means comprises a cross-connection and including bypass terminating means connected to said selected second transmission line path proximate locations of connections adapted for said test equipment.

13. The probe according to claim 12 wherein said bypass terminating means comprises an all-pass network for frequencies of interest.

14. A probe having a connector end and a probe tip end adapted for connecting electrical test equipment to selected points on a semiconductor wafer, said probe comprising:
   a support carrying a plurality of mutually insulated conductive paths in multiple layers including a first pair of said conductive paths forming a first transmission line means of predetermined impedance between said connector end and said probe tip end, and
   a second conductive path on said support forming a second transmission line means with at least one of said first pair of paths, said second transmission line means also extending between said connector end and said probe tip end and having substantially lower impedance than said predetermined impedance for providing a bypass return for said first transmission line means.

15. The probe according to claim 14 wherein said first pair of conductive paths comprise substantially a coplanar first transmission line, and said second conductive path forms a strip line with said at least one of said first pair.

16. The probe according to claim 14 wherein said first pair of conductive paths comprise a strip line of given spacing, and said second conductive path forms a strip line of narrower spacing with said at least one of said first pair.

17. The probe according to claim 16 including additional conductors in a substantially common plane with one of said first pair of conductive paths said additional conductors being separated by one of said first pair of conductive paths.

* * * * *

UNITED STATES PATENT AND TRADEMARK OFFICE
CERTIFICATE OF CORRECTION

PATENT NO. : 4,764,723
DATED : August 16, 1988
INVENTOR(S) : Eric W. Strid

It is certified that error appears in the above-identified patent and that said Letters Patent is hereby corrected as shown below:

Column 8, line 1, delete "probe" (second occurrence).

Signed and Sealed this

Fifteenth Day of May, 1990

*Attest:*

HARRY F. MANBECK, JR.

*Attesting Officer*     *Commissioner of Patents and Trademarks*